United States Patent
Alcoe

(10) Patent No.: US 7,109,732 B2
(45) Date of Patent: Sep. 19, 2006

(54) ELECTRONIC COMPONENT TEST APPARATUS

(75) Inventor: David Alcoe, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 446 days.

(21) Appl. No.: 10/630,722

(22) Filed: Jul. 31, 2003

(65) Prior Publication Data

US 2005/0022376 A1 Feb. 3, 2005

(51) Int. Cl.
*G01R 1/00* (2006.01)

(52) U.S. Cl. .................. 324/755; 324/765; 324/761

(58) Field of Classification Search ........ 324/754–761, 324/765; 439/482, 66–72
See application file for complete search history.

(56) References Cited

U.S. PATENT DOCUMENTS

| | | |
|---|---|---|
| 4,105,970 A | 8/1978 | Katz |
| 4,686,464 A | 8/1987 | Elsässer et al. |
| 4,851,765 A | 7/1989 | Driller et al. |
| 4,885,533 A | 12/1989 | Coe |
| 4,937,707 A | 6/1990 | McBride et al. |
| 5,032,787 A | 7/1991 | Johnston et al. |
| 5,057,969 A | 10/1991 | Ameen et al. |
| 5,159,535 A | 10/1992 | Desai et al. |
| 5,204,615 A | 4/1993 | Richards et al. |
| 5,391,995 A | 2/1995 | Johnston et al. |
| 5,435,732 A | 7/1995 | Angulas et al. |
| 5,453,701 A * | 9/1995 | Jensen et al. ............... 324/755 |
| 5,500,605 A * | 3/1996 | Chang ........................ 324/758 |
| 5,519,936 A | 5/1996 | Andros et al. |
| 5,804,984 A | 9/1998 | Alcoe et al. |
| 6,037,785 A * | 3/2000 | Higgins ..................... 324/754 |
| 6,046,597 A * | 4/2000 | Barabi ........................ 324/755 |
| 6,051,982 A | 4/2000 | Alcoe et al. |
| 6,208,155 B1 * | 3/2001 | Barabi et al. ............... 324/754 |
| 6,270,356 B1 * | 8/2001 | Hoshino et al. ............. 439/70 |
| 6,292,007 B1 | 9/2001 | Potter |

OTHER PUBLICATIONS

IBM Technical Disclosure Bulletin, vol. 25, No. 11B, Apr. 1983, pp. 6265-6266, "Spring Loaded Probe with Rotational Wiping Feature".
IBM Technical Disclosure Bulletin, vol. 37, No. 02B, Feb. 1994, pp. 603-604, "Tini-Probe Interposer Connector".

* cited by examiner

*Primary Examiner*—Vinh P. Nguyen
(74) *Attorney, Agent, or Firm*—Hinman, Howard & Kattell, LLP; Lawrence R. Fraley

(57) ABSTRACT

A test apparatus and method in which a compressible housing is used to retain an electronic component having conductors thereon. The compressible housing is lowered onto a suitable base member having upstanding probes which are also compressible and which physically engage respective ones of the conductors at one end thereof and an appropriate conductor (e.g., conductive pads on a printed circuit board) on the other when the test apparatus is fully assembled and testing occurs.

14 Claims, 3 Drawing Sheets

ELECTRONIC COMPONENT TEST APPARATUS

TECHNICAL FIELD

The invention relates to test apparatus for testing electronic components such as those used in information handling systems (computers) or the like. More particularly, the invention relates to such apparatus for testing high density electronic packaging structures, and even more particularly to those which utilize pluralities of extremely small conductive elements such as solder ball arrays as part thereof.

BACKGROUND OF THE INVENTION

Clearly, miniaturization is a main object of all electronic packaging developers and manufacturers. Accordingly, various electronic packages have been introduced within the past few (e.g., ten) years which accomplish this objective, examples being defined and illustrated in detail in the following U.S. Patent Numbers:

U.S. Pat. No. 4,937,707—McBride et al
U.S. Pat. No. 5,057,969—Ameen et al
U.S. Pat. No. 5,159,535—Desai et al
U.S. Pat. No. 5,435,732—Angulas et al
U.S. Pat. No. 5,519,936—Andros et al Typically, such packages utilize extremely small conductive members such as spherically-shaped solder balls as the connecting medium. Such solder balls may possess a diameter of only about 0.025 inch to about 0.035 inch, and in the final product for incorporation within a larger electronic structure (e.g., a microprocessor), are typically arranged in compact, highly dense arrays (e.g., those with the balls positioned apart on only 0.050 inch centers). The electrical circuitry for such packages is also highly dense, and may possess line widths as small as about 0.002 inch, with 0.002 spacings between lines. Even smaller elements are presently being contemplated for future products.

An excellent example of one such product is the HyperBGA® electronic package sold by the assignee of this invention. (HyperBGA is a registered trademark of the assignee, Endicott Interconnect Technologies, Inc.). This structure includes a laminate substrate with exceptional thermal compensating properties capable of effectively coupling at least one semiconductor chip thereon to an underlying substrate (e.g., printed circuit board), using such solder balls as mentioned above for both connections.

It is readily understood that testing of such substrates is a critical and necessary step during the manufacture thereof, in order to prevent subsequent failure when the package is utilized in a larger (and very expensive) assembly such as a microprocessor or the like. It is also understood that such testing can be a difficult, complex and time-consuming operation.

Examples of various means for testing electronic structures are illustrated in the following U.S. Letters Patents. In U.S. Pat. No. 4,105,970 (Katz), a test pin with a jagged edge is utilized, while in U.S. Pat. No. 4,686,464 (Elsasser), buckling beam connectors are used. A printed circuit board tester using a plurality of apparently spring-loaded pin contacts is described in U.S. Pat. No. 4,851,765 (Driller et al) and an electrical circuit test probe, also spring-loaded, is described in U.S. Pat. No. 4,885,533 (Coe). U.S. Pat. No. 5,032,787 (Johnston) describes an elongated test probe with a spring-loaded plunger which is rotated during movement to make contact with the desired object being tested, while U.S. Pat. No. 5,204,615 (Richards et al) describes a module claimed to be able to test "linear high density" test site arrays. U.S. Pat. No. 5,391,995 (Johnston) describes a spring-biased test probe having an end configured to make frictional pressure contact with the test site (e.g., a board). And, in U.S. Pat. Nos. 5,804,984 and 6,051,982, there are defined two test apparatus also using spring-biased contacts for testing such electronic packages as exemplified above (e.g., the HyperBGA® package). Both patents are co-authored by the inventor of the instant invention. In IBM Technical Disclosure Bulletin (TDB) Vol. 25, No. 1, B (April, 1983), there is defined a spring-loaded probe with a rotational wiping feature, the probe having a jagged tip portion. In IBM TDB vol. 37, no. 02B (February, 1994), another example of the aforementioned buckling beam connectors is defined.

When simultaneously testing pluralities of conductive members such as the above-described extremely small solder balls arranged in a highly dense array, it is quickly understood that precisioned alignment and proper pressure application of each test contact probe member are critical. Clearly, these contacts must maintain a spaced relationship from one another (or shorting can occur during test), and must also allow ease of movement of the individual probes toward and away from the object being tested. Equally important, these cannot exert excessive pressure onto the solder balls and/or the pads on which these are positioned because doing so could harm the underlying pad or dielectric layer supporting same. It is not believed that the test apparatus described in the above patents and published documents (TDBs) can provide such connection and movement in an effective and cost-efficient manner capable of meeting many of today's demanding production schedules.

It is believed, therefore, that a test apparatus capable of effectively testing highly dense arrays of conductive members such as small diameter solder balls in a precise yet expedient manner utilizing the optimum forces necessary on the balls such as taught herein would constitute a significant advancement in the art.

OBJECTS AND SUMMARY OF THE INVENTION

It is, therefore, a primary object of the present invention to enhance the electrical test apparatus art and particularly that portion of the art dedicated to testing highly dense conductor arrays on such electronic components as electronic packages.

It is another object of the invention to provide such a test apparatus which provides precise pressure application between the apparatus' contact probe members and the conductors being contacted as part of such testing.

It is yet another object of the invention to provide such a test apparatus which can be operated in a facile manner and is also relatively inexpensive to manufacture and operate.

In accordance with one embodiment of the invention, there is provided a test apparatus for making electrical contact with at least one (and preferably several) electrically conductive members of an electronic component comprising a compressible housing adapted for having an electronic component including a plurality of electrically conductive members compressibly positioned therein, a base member including a plurality of compressible probes positioned therein, and structure for bringing the compressible housing having the electronic component therein and the base member together such that selected ones of the compressible probes engage respective ones of the electrically conductive members of the electronic component.

BEST MODE FOR CARRYING OUT THE INVENTION

For a better understanding of the present invention, together with other and further objects, advantages and capabilities thereof, reference is made to the following disclosure and appended claims in connection with the above-described drawings.

It is understood that like numerals will be used to indicate like elements from FIG. to FIG. The views provided herein, all on an enlarged scale, are shown herein on such a scale for ease of illustration purposes.

Figure 1:
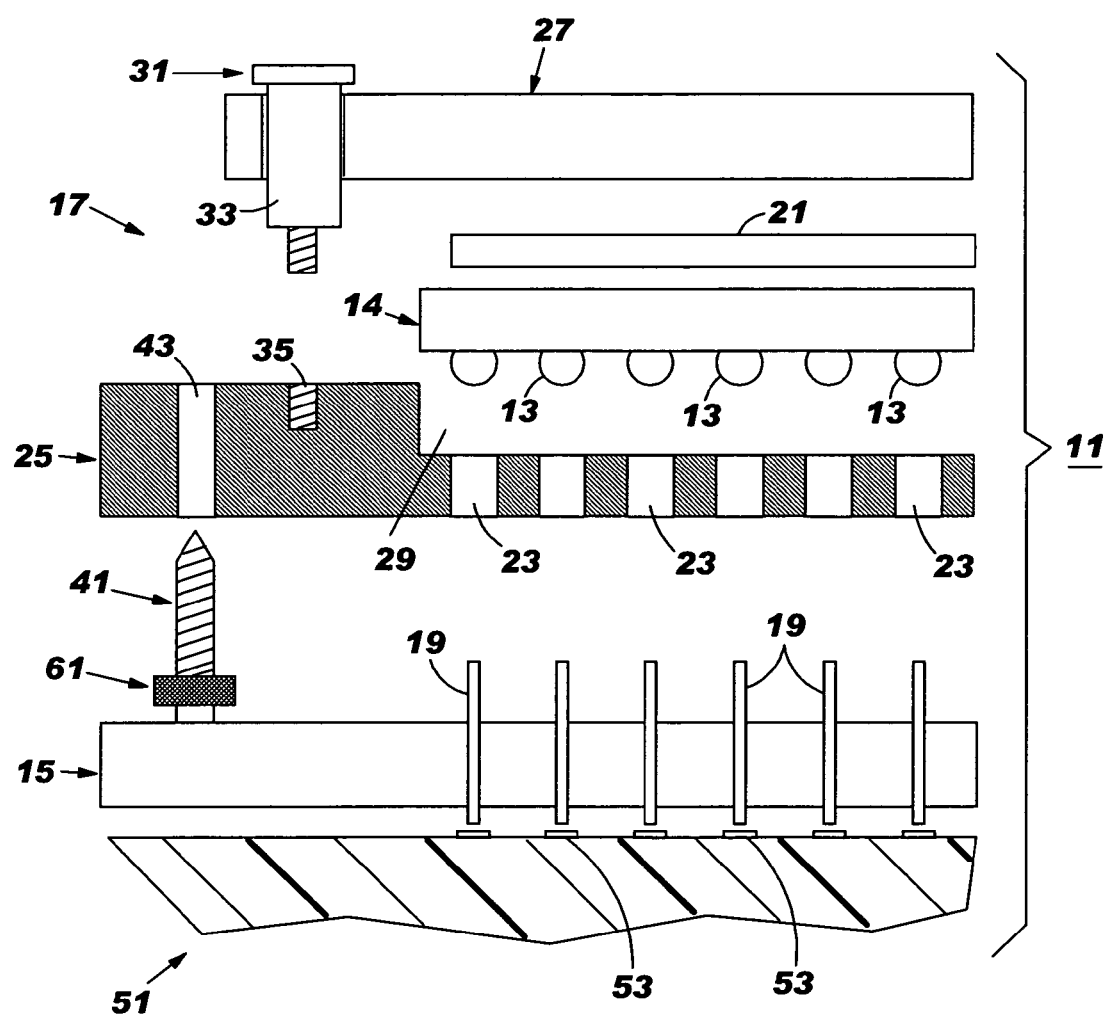
In FIG. 1, there is illustrated an exploded view of a test apparatus in accordance with one embodiment of the invention, this test apparatus capable of simultaneously testing several conductors of an electronic package (also shown)

FIG. 1 is a partial, side sectional view, in elevation and on a much enlarged scale, of a test apparatus 11 according to one embodiment of the invention which enables electrical contact with electrically conductive members (e.g., solder balls 13) of an electronic component 14.

Apparatus 11 includes a base member 15, a compressible housing 17, numerous compressible probe members 19, and a compressible member 21. It is understood that in the broader aspects of the invention apparatus 11 may include only one probe member as part thereof. For testing conductive arrays such as solder balls on a component such as defined hereinabove, however, several (e.g., from about 400 to as many as about 3,000) probe members may be utilized in accordance with the teachings herein. The test apparatus 11 is shown with an electronic component 14 (package) placed in housing 17, located so that various electrically conductive members 13 (e.g., solder balls) face downward. As seen, each probe member 19 aligns with a respective conductive member 13 and is thus designed for electrically contacting each respective member 13 in accordance with the teachings herein.

As stated, although only six probe members 19 are shown, several, including as many as 3,000, may be used, assuming 3,000 members 13 are utilized. The probe placement may be arranged in manners most suitable for electrical engagement with selected conductive member patterns of such electrical components 14. The electrically conductive members 13 of electrical component 14 are arranged in a first pattern, such that the probe members 19 are inserted through a corresponding second pattern of apertures 23. It may also be useful to include more (or even less) probe members 19 than electrical conductive members 13 for use of the test apparatus with a variety of designs of electrical components, depending on the test requirements for such components.

As seen in FIG. 1, compressible housing 17 includes a base 25 and a cover 27. Both base and cover are designed for being positioned together such that cover 27 will compressibly hold the electronic component 14 in position within an opening 29 defined by the lower base. In a preferred embodiment, cover 17 is secured to base 25 using a lock member 31 which, also in a preferred embodiment, comprises a rotational screw 33 which is rotatably positioned within cover 27. The rotational screw 23 is screwed into a threaded opening 35 within base 25 through a series of turns of the screw following initial positioning of component 14. Significantly, each of the conductive members (solder balls) 13 of component 14 are aligned relative to a respective one of the apertures 23 within base 25. As such, each conductive member will be exposed to a respective one of the upwardly projecting compressible probes 19 for eventual connection thereto whereupon testing can be performed using the present invention.

As further seen in FIG. 1, test apparatus 11 further includes an upstanding alignment member 41 positioned on base member 15 and projecting upwardly to receive base 25, the upstanding alignment member preferably a pin of tapered end configuration (as shown) which passes through the corresponding opening 43 within base 25. Although only one alignment member 41 is shown, it is understood that additional such members may be utilized for aligning base 25 with base member 15 as part of assembling the compressible test apparatus 11 to perform the desired testing. It is also understood that additional locking members 31 may be utilized at other locations on cover 27 and thus screw into corresponding other threaded openings within base 25.

As further seen in FIG. 1, test apparatus 11 includes the aforementioned compressible member 21 which is designed for being positioned substantially between an upper surface of component 14 and the under surface of the lockable cover 27. In a preferred embodiment, compressible member 21 comprises a compliant pad made of elastomeric material such as silicone rubber. Other materials and configurations for the compressible member are of course possible and within the skill of one in the art.

In FIG. 1 there is also shown a circuitized substrate 51 on which base member 15 is adapted for being positioned such that each of the compressible probes 19 may electrically engage a respective one of the substrate's conductive members (e.g., pads 53). Pads 53 may be typical conductive pads formed on a conventional printed circuit board, such a board being a preferred version of such a conductive substrate. Alternatively, it is also possible to simply connect the lower ends of probes 19 to respective wiring or the like such that this wiring is then connected to the various test metering and other units designed for providing the necessary testing of component 14. Substrate 51, if a printed circuit board or similar component having internal conductors (not shown) typically found in circuit boards and electrically coupled to the external pads 53, may instead provide this coupling to such testing and power apparatus. In a preferred embodiment, base member 15 and base 25 are comprised of high temperature molded plastic (e.g., Ryton) and cover 27 is comprised of thermally conductive metal such as copper or aluminum. (Ryton is a trademark of Chevron Phillips Chemical Company.) The lock and upstanding alignment member 31 and 41, respectively, are each preferably comprised of stainless steel. The above materials are not meant to limit the scope of the invention, however, in that others are readily possible to provide a satisfactorily working test apparatus in accordance with the teachings herein.

Although cover 27 is shown to be screwed onto base 25 to form the compressible housing 17, it is also possible to provide other means of securing these two elements together. For example, it is possible to pivotally secure an end of cover 27 to base 25 and then rotationally lower the base onto the compliant pad and component 14 positioned within base 25. Associated means for assuring planarity of the cover's under surface relative to the electronic component would be necessary, as such planar engagement between these two parts is considered important.

FIG. 1 also shows an adjustable member 61 located on the upstanding alignment pin 41 (and thus part thereof) and threaded thereon for movement upwardly and downwardly relative to the upper surface of base member 15. The rotational movement is represented by the arrow A in FIG. 2. The purpose of member 61 is to define the precise space between the under surface of base 25 and the base member's upper surface, and thus the exact point of engagement with elements 13 by compressible probes 19. This adjustment is considered important as part of the ability of the present invention to assure a proper engagement force applied to the relatively delicate solder balls 13 by probes 19 while simultaneously not disturbing the position of or otherwise harming these conductors. The invention is thus able to provide effective testing of such an electronic component as defined hereinabove in a non-destructive manner.

In a preferred embodiment, each of the compressible probes comprises a singular wire capable of compressing (e.g., bending or spring compression) when sufficient engagement force is realized between the probe ends and conductive members 13. This "resilience" of the probe members is also important to assure the appropriate application of force onto conductors 13 while still not causing harm thereto. To further assure such precise force application, the compressible housing utilizes the compliant pad 21 to also provide compensation for upward movement of the component 14 during engagement force application on conductors 13.

The above capabilities of apparatus 11 are considered extremely significant in order to assure the precise application of force on conductors 13, especially on a component such as described above, to assure non-destruction of the component. Such destruction can also occur to the underlying pads (not shown) on which the solder balls 13 are positioned, such pads known in the art and further description is not believed necessary (see e.g., one or more of the aforementioned patents) as well as the underlying dielectric layer supporting said pads in such a component.

Figure 3:
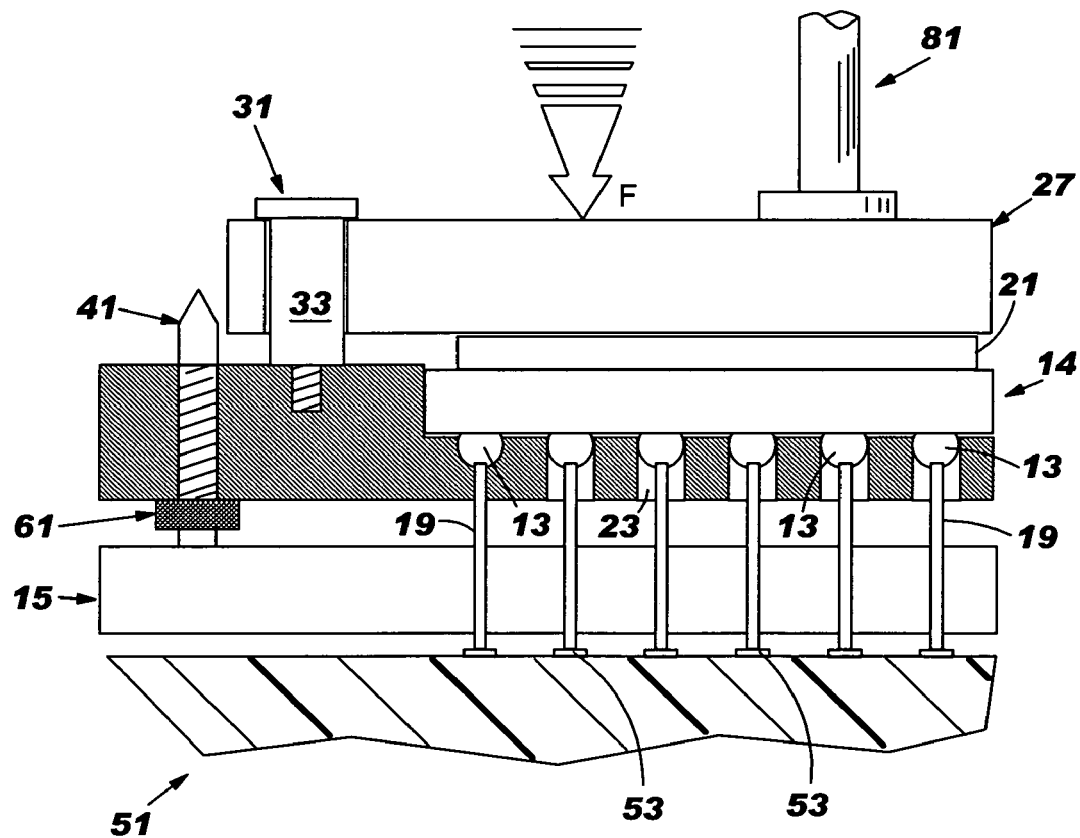
FIG. 3 is a view of the apparatus of FIGS. 1 and 2 in the test position.

Another aspect of the apparatus 11 which is extremely important is the ability to precisely control and limit the force which is applied by the compressible probe members 19 onto the electrically conductive members 13 despite high values of the actuating force F which can be applied to the cover 27 (as depicted in FIG. 3). This aspect can be attained by limiting the compression of the probe members 19 to a predetermined value, which can be set by adjustable member 61 in conjunction with positioning of base 25 of the compressible housing. Once that compression value is achieved, additional force applied to cover 27 does not result in increased probe compression or compressive loading to electronic component 14. Thus, additional, and potentially damaging forces on electronic component 14 are avoided. A further protective aspect of the apparatus 11 is a cover 27 which includes a relatively stiff material (preferable a thermally conductive metal such as copper or aluminum), which prevents flexing as the actuation force F is applied. This prevents potentially damaging bending and loading to the delicate electronic component 14. The use of a compressible member 21 provides for even distribution of pressure to the electronic component as positioning and probe forces are applied, so as to avoid bending and potential damage to component 14 during operation.

The preferred sequence of operation of apparatus 11 is to position the electronic component 14 into opening 29 of base 25, such that selected conductive members 13 are aligned with openings 23 of base 25. The electronic component 14 is then held in position by bringing cover 27 with compressible member 21 into contact with electronic component 14 and locking the assembly into position with lock member 31. The amount of pressure on the component is predetermined by the geometry of compressible housing 17 and resilience of the compressible member 21; the lock member 31 can be adjusted to provide minimal holding pressure. Due to manufacturing tolerance, some non-flatness of the component 14 and the compressible housing 17 may exist. Such non-flatnesses can result in bending of the electronic component 14 as holding and test probe forces are applied; the compressible member 21 allows for more even distribution of pressure and minimal bending stress to the electronic component during use of apparatus 11. With the component is safely positioned in compressible housing 11, alignment member 61 is engaged with a corresponding opening 43 in base 25 to provide for positional alignment of probe members 19 with apertures 23. (This positional alignment may be attained prior to positioning of component 14.) By application of force, probe members 19 are compressed up to a predetermined maximum compression value so as to obtain electrical contact between probe members 19 and selected electrically conductive members 13. Because of the structures of the invention, it is not necessary to limit the application of force so as to correspondingly limit the probe compression. Thus, the amount of compressive force applied to the electronic component 14 by probe 19 is protectively limited by the invention to only that needed to obtain electrical contact. This assures effective load application to obtain optimum forces on the desired component, namely the conductors 13 by probes 19, without destruction of the component 14 through extraneous bending, unwanted excessive loading, or complex actuation force controls.

Figure 2:
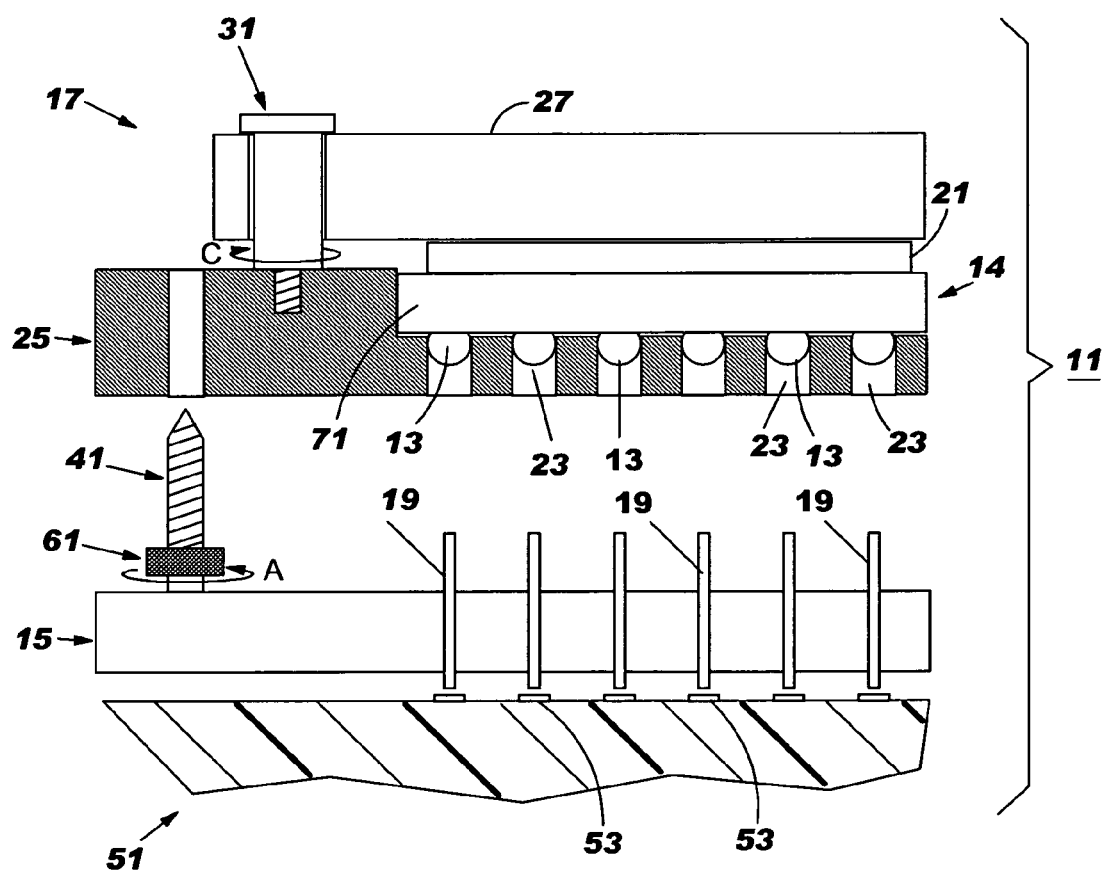
FIG. 2 is also an exploded view of the apparatus of FIG. 1, showing the compressible positioning of an electronic component within part thereof (the housing)

In FIG. 2, the first step of performing the test of component 14 is shown. In this step, cover 27 is now secured to base 25 using lock member 31 (the rotational movement thereof represented by the arrow C. Component 14 is aligned on base 25 such that each of the conductors extend within a respective aperture 23 of base 25. The compliant pad 21 is also in position and physically contacting both the under surface of cover 27 and the top surface of component 14. Although the component 14 is shown to include simply a substrate 71 having the solder balls 13 attached thereto, this component may further include additional elements such as one or more semiconductor chips electrically coupled to the opposite surface of the substrate 71 from solder balls 13, a heat sink or other structure positioned thereover for providing heat escape from the operating component, and other elements. If these additional elements are used, the invention is readily adaptable thereto such that cover 17 can directly engage these (e.g., especially a heat sink which typically is the uppermost part of such a component) and still assure the appropriate compression of component 14 within the compressible housing 17. In addition, compressible member 21 is positioned to define the desired spacing between the compressible housing and base member 15 as described above.

In FIG. 3, compressible housing 17 is pressed downwardly onto base member 15 and engagement between the compressible probes 19 and solder balls 13 occurs. The opposing ends of probes 19 are in turn directly positioned on (and in engagement with) pads 53 of the circuit board 51. Component 14 can now be subjected to a series of testing programs to determine its acceptability for eventual sale. The preferred structure for pressing downwardly on cover 27 is a pneumatically actuated piston 81 which applies the aforementioned force F onto the cover's upper surface. Understandably, more than one such pistons may be utilized, and alternative structures may also be used to provide this desired force. The use of pneumatics, especially air, for the force application is preferred because of simplicity of design, reliable control operation, rapid actuation speed, and easy power delivery without extraneous electronic fields. Control of the precise value of force F is generally difficult and in conflict with some of these aspects. Use of the structures of the present invention provides for precise control of force F conductors 13, given imperfect control of load application.

Although not clearly seen in FIG. 3, it is understood that each of the probes 19 is capable of individually compressing and may bend slightly and compress as force F is applied while still preventing destruction or harm to component 14. These probes may also be of telescoping construction such that one cylindrical portion thereof moves within a larger diameter cylindrical portion and is biased upwardly, e.g., by an internal spring.

Thus there has been shown and described a test apparatus and a method for testing in which relatively delicate electrically conductive members such as very small solder balls on an electronic component can be physically engaged with a precise force sufficient to assure effective coupling of the conductors to respective testing apparatus without damage thereto. The structure and method as explained herein is relatively inexpensive to utilize and perform, respectively, while still assuring these unique capabilities.

While there have been shown and described what are at present the preferred embodiments of the invention, it will be obvious to those skilled in the art that various changes and modifications may be made therein without departing from the scope of the invention as defined by the appended claims.

What is claimed is:

1. A test apparatus for providing contact with a plurality of electrically conductive members of an electronic component, said test apparatus comprising:
a compressible housing adapted for having an electronic component including a plurality of electrically conductive members compressibly positioned therein, said compressible housing including a base and a cover and a compressible member positioned between said base and cover and between said cover and said electronic component when said electronic component is positioned within said compressible housing;
a base member including a plurality of compressible probes positioned therein, said base of said compressible housing being adapted for being positioned on said base member; and
structure for bringing said compressible housing having said electronic component therein and said base member together such that selected ones of said compressible probes engage respective ones of said electrically conductive members of said electronic component, said base member including at least one upstanding alignment member and said base including an opening therein, said upstanding alignment member adapted for passing through said opening in said base during said bringing of said compressible housing and said base member together such that said base will engage said alignment member in such a manner so as to prohibit excessive force application onto said electrically conductive members by said compressible probes.

2. The test apparatus of claim 1 wherein said base defines an opening therein, said electronic component adapted for being positioned within said opening.

3. The test apparatus of claim 1 wherein said base includes a plurality of apertures therein, said selected ones of said compressible probes adapted for passing through respective ones of said apertures to engage said respective ones of said electrically conductive members.

4. The test apparatus of claim 1 further including a lock member movably positioned within said cover to lock said cover onto said base in a compressible manner.

5. The test apparatus of claim 4 wherein said lock member is a rotational screw adapted for being screwed into said base to provide said lock of said cover onto said base.

6. The test apparatus of claim 1 wherein said compressible member is a compliant pad.

7. The test apparatus of claim 1 wherein said upstanding alignment member includes an adjustable member adapted for adjusting the positional relationship between said compressible housing and said base member.

8. The test apparatus of claim 1 further including a conductive substrate having a plurality of conductive pads thereon, said base member adapted for being positioned on said conductive substrate such that said selected ones of said compressible probes electrically engage a respective one of said conductive pads.

9. The test apparatus of claim 8 wherein said conductive substrate comprises a printed circuit board.

10. The test apparatus of claim 1 wherein said structure for bringing said compressible housing and said base member together includes a pneumatically-driven member adapted for engaging said cover of said compressible housing to exert a force on said cover.

11. The test apparatus of claim 10 wherein said pneumatic-driven member includes a piston.

12. A method of testing an electronic component having a plurality of electrically conductive members, said method comprising:
positioning an electronic component having a plurality of electrically conductive members within a compressible housing including a base and a cover and a compressible member positioned between said base and cover and between said cover and said electronic component when said electronic component is positioned within said compressible housing;
providing a base member including a plurality of compressible probes therein, said base of said compressible housing adapted for being positioned on said base member; and
bringing said compressible housing having said electronic component therein and said base member together such that selected ones of said compressible probes engage respective ones of said electrically conductive members of said electronic component, said base member including at least one upstanding alignment member and said base including an opening therein, said upstanding alignment member passing through said opening in said base during said bringing of said compressible housing and said base member together such that said base engages said alignment member in such a manner so as to prohibit excessive force application onto said electrically conductive members by said compressible probes.

13. The method of claim 12 wherein said positioning of said electronic component comprises positioning said component on said base and locking said cover onto said base to lock said electronic component in position.

14. The method of claim 12 wherein said base is provided with a plurality of apertures therein, said bringing together of said compressible housing and said base member causing selected ones of said compressible probes to pass through respective ones of said apertures prior to engaging electrically conductive members.

* * * * *